(12) United States Patent
Jeong

(10) Patent No.: US 9,311,987 B2
(45) Date of Patent: Apr. 12, 2016

(54) SEMICONDUCTOR MEMORY DEVICE CONTROLLING REFRESH CYCLE, MEMORY SYSTEM, AND METHOD OF OPERATING THE SEMICONDUCTOR MEMORY DEVICE

(71) Applicant: Samsung Electronics Co., Ltd., Suwon-si (KR)

(72) Inventor: In-Chul Jeong, Suwon-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/685,912

(22) Filed: Apr. 14, 2015

(65) Prior Publication Data

US 2015/0221362 A1 Aug. 6, 2015

Related U.S. Application Data

(63) Continuation of application No. 13/896,511, filed on May 17, 2013, now Pat. No. 9,030,905.

(30) Foreign Application Priority Data

May 17, 2012 (KR) ........................ 10-2012-0052593

(51) Int. Cl.
  *G11C 7/00* (2006.01)
  *G11C 11/406* (2006.01)
  *G11C 11/408* (2006.01)

(52) U.S. Cl.
  CPC ............ *G11C 11/40626* (2013.01); *G11C 7/00* (2013.01); *G11C 11/4087* (2013.01); *G11C 11/40611* (2013.01); *G11C 11/40618* (2013.01); *G11C 11/40622* (2013.01)

(58) Field of Classification Search
  USPC .................................... 365/222, 230.03, 211
  See application file for complete search history.

(56) References Cited

U.S. PATENT DOCUMENTS

| 6,529,433 | B2 | 3/2003 | Choi |
| 6,807,121 | B2 | 10/2004 | Natsui et al. |
| 7,095,669 | B2 | 8/2006 | Oh |
| 7,301,844 | B2 | 11/2007 | Dono et al. |
| 7,471,586 | B2 | 12/2008 | Koshikawa |

(Continued)

FOREIGN PATENT DOCUMENTS

| JP | 2000-298982 | 10/2000 |
| JP | 2002-063787 | 2/2002 |

(Continued)

*Primary Examiner* — Vu Le
(74) *Attorney, Agent, or Firm* — Muir Patent Law, PLLC

(57) ABSTRACT

A semiconductor memory device includes a memory cell array, a refresh control circuit, an address counter and an address converter. The memory cell array includes a plurality of memory cells. The refresh control circuit is configured to receive a refresh command and output m refresh control signals during one refresh cycle for refreshing all the memory cells of the semiconductor memory device. The address counter is configured to generate counting signals for refreshing memory cells in response to the m refresh control signals. The address converter is configured to receive the counting signals and output refresh addresses by converting the counting signals in response to a cycle select signal. The address converter is configured to output refresh addresses such that the number of m refresh control signals during one refresh cycle is variable.

6 Claims, 12 Drawing Sheets

(56) References Cited

U.S. PATENT DOCUMENTS

| | | |
|---|---|---|
| 7,663,956 B2 | 2/2010 | Ishikawa |
| 7,760,572 B2 | 7/2010 | Koshita |
| 7,961,543 B2 | 6/2011 | Koshita |
| 8,520,461 B2 | 8/2013 | Lee et al. |
| 8,547,759 B2 | 10/2013 | Kadowaki |
| 8,681,578 B2 | 3/2014 | Narui |
| 8,885,432 B2 | 11/2014 | Narui |
| 2004/0093461 A1 | 5/2004 | Kim |
| 2005/0108460 A1* | 5/2005 | David ............... G11C 11/406 711/5 |
| 2006/0104140 A1 | 5/2006 | Tahara |
| 2007/0195627 A1* | 8/2007 | Kim ............... G11C 11/406 365/222 |
| 2010/0232246 A1 | 9/2010 | Chung |
| 2012/0151131 A1* | 6/2012 | Kilmer ............... G11C 11/406 711/106 |
| 2013/0279284 A1 | 10/2013 | Jeong |
| 2014/0085999 A1 | 3/2014 | Kang |
| 2014/0132836 A1 | 5/2014 | Jung |

FOREIGN PATENT DOCUMENTS

| | | |
|---|---|---|
| JP | 2007-287267 | 11/2007 |
| JP | 2008-135113 | 6/2008 |
| JP | 2008-146781 | 6/2008 |
| JP | 2011-065743 | 3/2011 |
| JP | 2012-022751 | 2/2012 |
| JP | 2012-038399 | 2/2012 |
| KR | 0618858 | 3/2006 |

* cited by examiner

SEMICONDUCTOR MEMORY DEVICE CONTROLLING REFRESH CYCLE, MEMORY SYSTEM, AND METHOD OF OPERATING THE SEMICONDUCTOR MEMORY DEVICE

CROSS-REFERENCE TO RELATED APPLICATION

This application is a Continuation of U.S. patent application Ser. No. 13/896,511, filed on May 17, 2013, which claims the benefit of priority to Korean Patent Application No. 10-2012-0052593, filed on May 17, 2012, in the Korean Intellectual Property Office, the disclosure of which is incorporated herein in its entirety by reference.

BACKGROUND

Various example embodiments relate to a semiconductor memory device, and more particularly, to a semiconductor memory device controlling a refresh cycle, a memory system, and a method of operating the semiconductor memory device.

Capacities and speeds continue to increase for semiconductor devices, widely used in high performance electronic systems. A dynamic random access memory (DRAM), i.e., an example of a semiconductor device, is a volatile memory, wherein data is represented by charge stored in a capacitor. Since the charge stored in the capacitor leaks over time, DRAM memory cells have a finite data retention characteristics.

A refresh operation is periodically performed to maintain data stored in the memory cell of the DRAM. Timing of the refresh cycle is often determined based on design specifications, wherein a refresh cycle having a uniform value is applied to all memory cells. However, since the level of difficulty of the process technology is increased according to a continuous DRAM process scaling, uniformity of processing across the DRAM device deteriorates which may cause manufacturing production yield to deteriorate.

SUMMARY

The present disclosure provides a semiconductor memory device, a memory system, and a method of operating the semiconductor memory device, wherein deterioration of a production yield is reduced by performing a refresh operation suitable for a data retention characteristic of a memory cell.

The disclosure also provides a semiconductor memory device, a memory system, and a method of operating the semiconductor memory device, wherein power consumption according to a refresh operation may be reduced and data may be stably maintained by adjusting a refresh cycle according to a data retention characteristic of a memory cell.

According to one embodiment, there is provided a semiconductor memory device including a memory cell array, a refresh control circuit, an address counter and an address converter. The memory cell array includes a plurality of memory cells. The refresh control circuit is configured to receive a refresh command and output m refresh control signals during one refresh cycle for refreshing all memory cells of the semiconductor memory device. The address counter is configured to generate counting signals for refreshing memory cells in response to the m refresh control signals. The address converter is configured to receive the counting signals and output refresh addresses by converting the counting signals in response to a cycle select signal. The address converter is configured to output refresh addresses such that the number of m refresh control signals during one refresh cycle is variable.

According to one embodiment, there is provided a method of a semiconductor memory device including a memory cell array. The method includes entering a refresh mode in response to an outer external refresh command; for all memory cells of the memory cell array, generating refresh addresses in response to a m refresh control signals during one refresh cycle; and periodically refreshing a first number of memory cells of the memory cell array in response to the refresh addresses during one refresh cycle. The first number of memory cells to be refreshed during one refresh cycle is variable.

According to one embodiment, there is provided a semiconductor memory device including a memory cell array, a command decoder and a refresh control circuit. The memory cell array includes a plurality of memory cells. The command decoder is configured to generate an internal refresh command based on an external command. The refresh control circuit is configured to receive the internal refresh command and output m refresh control signals during one refresh cycle for refreshing all memory cells of the semiconductor memory device. The number of memory cells to be refreshed at one refresh control signal is variable.

BRIEF DESCRIPTION OF THE DRAWINGS

Exemplary embodiments will be more clearly understood from the following detailed description taken in conjunction with the accompanying drawings in which.

DETAILED DESCRIPTION OF THE EMBODIMENTS

Hereinafter, the exemplary embodiments will be described in detail with reference to the attached drawings that are referred to in order to gain a sufficient understanding of the exemplary embodiments. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the present disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Unless expressly defined in a specific order herein, respective steps described in the present disclosure may be performed otherwise. That is, the respective steps may be performed in a specified order, substantially at the same time, or in reverse order.

Hereinafter, example embodiments will be described in detail with reference to the accompanying drawings.

In order to maintain data in dynamic random access memory (DRAM), a refresh system is used. Examples of refresh operations include a normal refresh operation that is performed in response to receipt of an external refresh command or an external refresh address, and an auto refresh or self refresh operation, that internally generates a refresh address.

Figure 1:
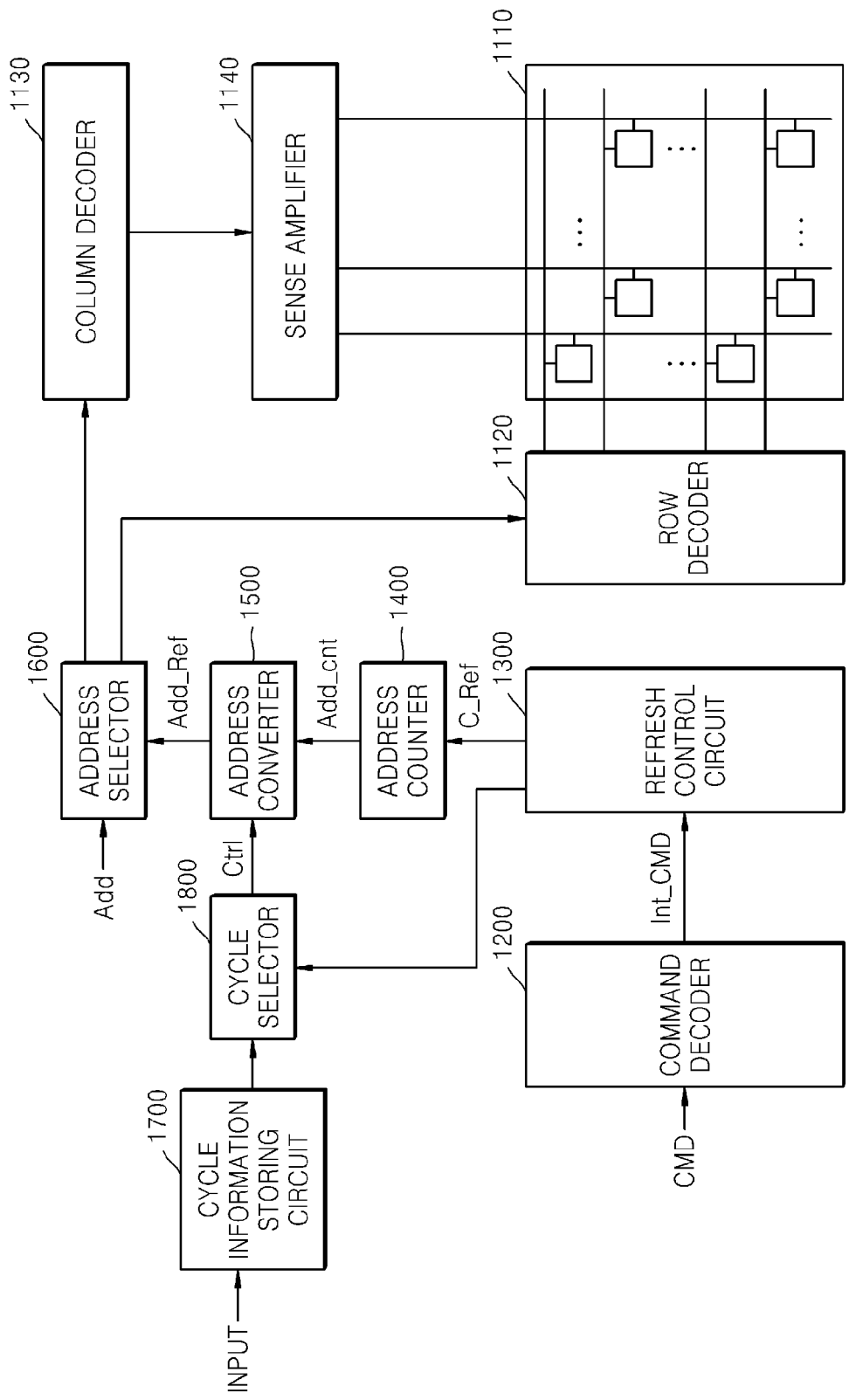
FIG. 1 is a block diagram of a semiconductor memory device according to some embodiments.

FIG. 1 is a block diagram of a semiconductor memory device 1000 according to some embodiments. As shown in FIG. 1, the semiconductor memory device 1000 may include a memory cell array 1110 including a plurality of memory cells, a row decoder 1120 for driving rows (e.g., word lines, WL) of the memory cell array 1110, a column decoder 1130 for driving columns (e.g., column selection lines, CSL) of the memory cell array 1110, and a sense amplifier 1140 for sensing and amplifying data. Also, the semiconductor memory device 1000 may include a command decoder 1200, a refresh control circuit 1300, an address counter 1400, and an address selector 1600 as peripheral circuits for accessing the memory cell array 1110 and/or performing a refresh operation. The semiconductor memory device 1000 may be a monolithic integrated circuit such as a semiconductor chip. Alternatively, semiconductor memory device 1000 may comprise a group of chips in a semiconductor package, such as a stack of semiconductor memory chips. In this alternative, each of the chips may form part of memory cell array 1110. A master semiconductor chip may include some or all of the circuitry described herein external to the semiconductor memory device 1000 shown in FIG. 1 to access and/or refresh the memory cell array 1110.

The circuitry of the semiconductor memory device 1000 may further include an address converter 1500 for receiving a counting signal Add_cnt generated by the address counter 1400 and outputting a refresh address Add_Ref by converting at least one bit of the counting signal Add_cnt, a cycle information storing circuit 1700 for storing refresh cycle information according to an input INPUT related to a refresh cycle, and a cycle selector 1800 for outputting a cycle select signal Ctrl in response to the refresh cycle information stored in the cycle information storing circuit 1700.

The command decoder 1200 generates an internal command by decoding an external command received from outside the semiconductor memory device 1000. When the external command is a refresh command CMD, the command decoder 1200 decodes the refresh command CMD to generate an internal refresh command Int_CMD and provides the internal refresh command Int_CMD to the refresh control circuit 1300. The refresh control circuit 1300 receives the internal refresh command Int_CMD and generates a refresh control signal C_Ref in response to the internal refresh command Int_CMD. For example, in order to refresh all memory cells included in the memory cell array 1110, a plurality of refresh commands CMD may be provided from outside the semiconductor memory device 1000 in one refresh cycle, and the internal refresh command Int_CMD and the refresh control signal C_Ref may be generated for each of the refresh commands CMD. Alternatively, the semiconductor memory device 1000 may receive an external command instructing the semiconductor memory device 1000 to enter a self refresh mode. When in the self refresh mode, the refresh control circuit 1300 may generate the refresh control signal C_Ref in response to an internal clock signal (e.g., an internal clock signal periodically generated with an oscillator (not shown) in the semiconductor memory device 1000). The self refresh mode may continue so that plural refresh cycles are sequentially performed (until the self refresh mode is exited), where each refresh cycle includes refresh operations for plural rows or all of the active memory cell array 1110.

The address counter 1400 generates the counting signal Add_cnt by performing a counting operation in response to the refresh control signal C_Ref. In order to perform a refresh operation on the memory cell array 1110, the counting signal Add_cnt includes information related to an address for driving a row. The memory cell array 1110 includes a plurality of regions, and the counting signal Add_cnt includes at least one address bit. The regions of the memory cell array 1110 described above may be in page units selected by one row address, wherein at least one page is selected according to a bit value of the counting signal Add_cnt and memory cells included in the selected page are refreshed.

The address converter 1500 generates the refresh address Add_Ref by converting at least one bit of the counting signal Add_cnt, and as the generated refresh address Add_Ref is provided to the row decoder 1120, a region of the memory cell array 1110 to be refreshed is selected. The number of memory cells (or the number of pages) to be refreshed is adjusted by one internal refresh command Int_CMD according to an address converting operation of the address converter 1500. Alternatively, the number of memory cells (or the number of pages) to be refreshed may be adjusted by one refresh command CMD or one refresh control signal C_Ref.

The address converting operation of the address converter 1500 may include an operation of don't-care processing or not don't-care processing at least one bit of the counting signal Add_cnt. The number of memory cells to be refreshed by one refresh control signal C_Ref may be increased by don't-care processing at least one bit of the counting signal Add_cnt or may be decreased by not don't-care processing at least one bit of the counting signal Add_cnt.

The address selector 1600 receives an address Add provided from outside the semiconductor memory device 1000 along with the refresh address Add_Ref. The address Add from outside the semiconductor memory device 1000 may be provided for a normal operation of the semiconductor memory device 1000, wherein the address selector 1600 selectively outputs the refresh address Add_Ref or the address Add according to an operation mode of the semiconductor memory device 1000. The address Add may include a row address provided to the row decoder 1120 and a column address provided to the column decoder 1130, and the refresh address Add_Ref may have an address value for selecting at least one page of the memory cell array 1110.

The cycle information storing circuit 1700 stores refresh cycle information of the semiconductor memory device 1000 in a non-volatile manner according to the input INPUT related to a refresh cycle. The cycle information storing circuit 1700 is a device for storing information, and may include a storage device such as a register or a fuse (including a regular fuse or an anti-fuse), or may be realized by a unit for fixably storing information through a metal line. For example, the cycle information storing circuit 1700 may be realized in an array including a fuse (including a regular fuse or an anti-fuse), or in a mode register set (MRS) storing an operation mode of the semiconductor memory device 1000.

When the cycle information storing circuit 1700 is realized in a metal line or a laser fuse storing information as a fuse cutting by a laser beam, the refresh cycle information of the semiconductor memory device 1000 may have a fixed value. On the other hand, when the cycle information storing unit 1700 is realized in a MRS including a plurality of registers or an electric fuse storing information by an electric signal (or a voltage signal), the refresh cycle information of the semiconductor memory device 1000 may be arbitrarily set by a user and a refresh operation is performed according to a refresh cycle set by the user.

The cycle selector 1800 receives the refresh cycle information from the cycle information storing circuit 1700, and generates the cycle select signal Ctrl for controlling the address converting operation in response to the refresh cycle information. The address converting operation of the address converter 1500 may be controlled by the cycle select signal Ctrl from the cycle selector 1800, wherein the number of memory cells being refreshed per refresh control signal C_Ref varies by the address converting operation. Accordingly, the refresh cycle (or a time taken to refresh all memory cells of the memory cell array 1110) may be controlled according to the cycle select signal Ctrl from the cycle selector 1800. The cycle select signal Ctrl may include at least one control signal for controlling conversion of at least one bit of the counting signal Add_cnt. The at least one control signal may have different values according to generation of the refresh control signal C_Ref, and thus the refresh control signal C_Ref may be provided to the cycle selector 1800.

In FIG. 1, the cycle information storing circuit 1700 and the cycle selector 1800 are illustrated as different functional blocks, but an embodiment of the disclosure is not limited thereto. For example, the cycle information storing circuit 1700 and the cycle selector 1800 may be realized as the same functional blocks, wherein the cycle select signal Ctrl may be generated according to the stored refresh cycle information and provided to the address converter 1500.

The memory cell array 1110 includes a plurality of regions, for example, n regions. Also, the refresh control signal C_Ref may be generated in response to the refresh command CMD or an internal clock signal (not shown), and as memory cells included in one region of the memory cell array 1110 are refreshed by one refresh control signal C_Ref, memory cells of all regions of the memory cell array 1110 may be refreshed by n refresh control signals C_Ref. Alternatively, memory cells included in two regions may be refreshed by one refresh control signal C_Ref, and at this time, a refresh cycle is halved.

According to an embodiment, the number of memory cells being refreshed may vary according to an input of the refresh command CMD (or generation of the refresh control signal C_Ref or internal refresh command Int_CMD) based on a cycle selecting operation of the cycle selector 1800 and the address converting operation of the address converter 1500. Accordingly, the average number of memory cells being refreshed by the refresh control signal C_Ref in one refresh cycle may be increased or decreased by an integer multiple of a predetermined reference number (for example, a) as well as by a positive real number multiple of the predetermined reference number (for example, 1.25*a). In other words, the refresh cycle of the semiconductor memory device 1000 may be increased or decreased by an integer multiple of a predetermined reference cycle (for example, 64 ms) as well as by a positive real number multiple of the predetermined reference cycle.

According to the embodiment disclosed herein, since the refresh cycle may be increased or decreased by a precise interval according to a data retention characteristic of a memory cell, it is possible to set a refresh cycle optimized to characteristics of the memory cell and a production yield deterioration that may be generated as a refresh characteristic of the memory cell deviates from a specification may be prevented. Also, if the refresh cycle needs to be short according to the characteristics of the memory cell, the refresh cycle may be adjusted in a multiple of decimal point units instead of multiple units of a reference cycle (for example, two times of a reference cycle), and thus an increase in power consumption due to frequent refresh may be prevented.

Figure 2A:
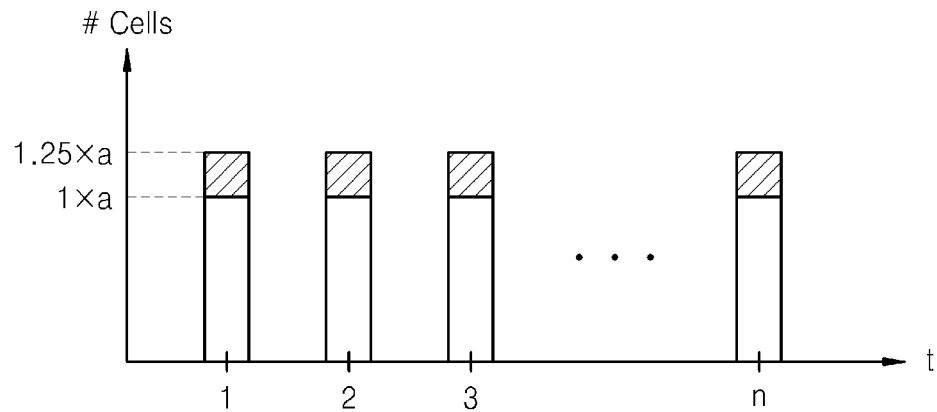
FIGS. 2A to 2C are diagrams for each describing the number of memory cells refreshed per one refresh control signal, according to embodiments.
Figure 2B:
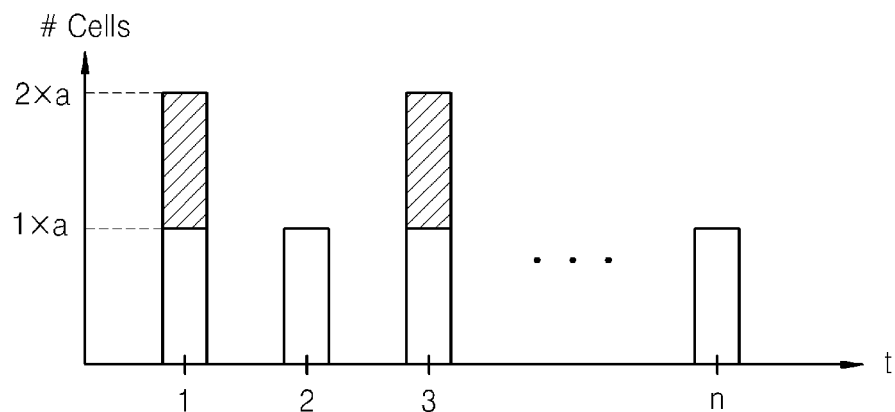
Figure 2C:
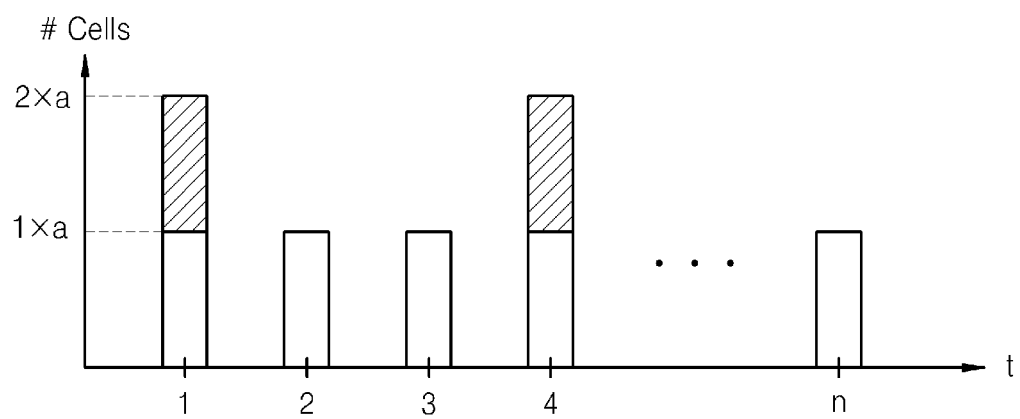

FIGS. 2A to 2C are diagrams for each describing the number of memory cells refreshed per one refresh control signal, according to embodiments. In FIGS. 2A to 2C, a horizontal axis denotes time t and a vertical axis denotes the number of memory cells #Cells. Numbers shown on the horizontal axis may denote n refresh control signals that are sequentially generated (hereinafter, referred to as first through (n)th refresh control signals). Operations of a semiconductor memory device according to an embodiment will now be described with reference to FIGS. 1 and 2A to 2C.

A graph of FIG. 2A shows an example where the same numbers of memory cells are refreshed per refresh control signal C_Ref. In the graph of FIG. 2A, the number of memory cells refreshed by one refresh control signal C_Ref corresponds to a multiple of decimal point units (e.g., an integer value or a non-integer decimal value) of a predetermined reference number (for example, a). For example, the predetermined reference number may indicate the number of memory cells being refreshed by one refresh control signal C_Ref when a general refresh cycle of the semiconductor memory device 1000 is 64 ms. Alternatively, the number of memory cells being refreshed per refresh control signal C_Ref based on another refresh cycle may be determined as the predetermined reference number. According to an embodiment, the number of memory cells corresponding a multiple of decimal point units (for example, 1.25*a) may be refreshed instead of an integer multiple of a reference number according to one refresh control signal C_Ref.

In one embodiment, the semiconductor memory device 1000 may have four memory banks (A to D) controlling by four refresh control signals (Ctrl A to D), respectively. For example, the number of memory cells of each memory bank to be refreshed during one refresh cycle is "a" in response to each control signal (e.g., logic level "H") and the number of memory cells of each memory bank to be refreshed during one refresh cycle is 2*a in response to each control signal (e.g., logic level "L"). When the control signal Ctrl A is L,H,H,H,L,H,H,H . . . , the control signal Ctrl B is H,L,H,H, H,L,H,H . . . , the control signal Ctrl C is H,H,L,H,H,H,L, H . . . , and the control signal Ctrl D is H,H,H,L,H,H,H, L . . . , the average number of memory cells of the semiconductor memory device 1000 to be refreshed at a respective refresh control signal is 1.25*a.

In one embodiment, the memory cell array 1110 may include a plurality of memory banks (e.g., 4 memory banks) Each memory bank includes a plurality of regions, and memory cells of the regions of each memory bank are refreshed by the refresh address Add_Ref. A refresh operation may be simultaneously performed on the plurality of memory banks, wherein the numbers of memory cells being refreshed in each memory bank may be differently controlled by the address converting operation of the address converter 1500.

For example, in order to assign a region of any one of the memory banks (for example, a first memory bank) to be refreshed, at least one bit of the counting signal Add_cnt is don't-care processed so that at least one bit of the refresh address Add_Ref is in a don't-care state. Accordingly, memory cells in at least two regions of the first memory bank are simultaneously refreshed. On the other hand, the refresh addresses Add_Ref of the remaining memory banks is not don't-care processed, and thus memory cells in one region of each memory bank are refreshed.

Then, at least one bit of a refresh address for assigning a region of another memory bank (for example, a second memory bank) to be refreshed in response to a following refresh control signal C_Ref is turned into a don't-care state, and refresh addresses of remaining memory banks are not turned into a don't-care state. By sequentially performing the refresh operation as such for all memory banks, the average number of memory cells refreshed according to each refresh control signal C_Ref in one refresh cycle may have a value corresponding to a multiple of decimal point units (for example, 1.25*a) of the predetermined reference number "a".

A graph of FIG. 2B shows an example where different numbers of memory cells are refreshed according to each refresh control signal C_Ref. In the graph of FIG. 2B, one memory bank (for example, the first memory bank) is described as an example, and other memory banks may be refreshed in the same or similar manner as the first memory bank.

According to a first refresh control signal C_Ref, at least one bit of the refresh address Add_Ref for assigning a region of the first memory bank to be refreshed is turned into a don't-care state, and thus memory cells in a plurality of regions (for example, two regions) of the first memory bank are selected. Accordingly, the number of memory cells corresponding to two times (2*a) of the reference number is refreshed.

Then, the refresh address Add_Ref is not in a don't-care state according to a second refresh control signal C_Ref, and thus memory cells (1*a) corresponding to one region of the first memory bank are selected and refreshed. Then, the above operations may be alternately performed according to following refresh control signals C_Ref. In this case, the average number of the memory cells being refreshed according to each refresh control signal C_Ref in one refresh cycle may correspond to a multiple in decimal point units of the reference number. For example, in the embodiment of the graph of FIG. 2B, the average number of memory cells being refreshed according to each refresh control signal C_Ref may be 1.5*a. Since the average number of memory cells being refreshed according to each refresh control signal C_Ref is increased, a refresh cycle for refreshing all memory cells of the memory cell array 1110 is reduced.

Alternatively, according to a respective refresh control signal C_Ref, at least one bit of the refresh address Add_Ref for assigning a region of the first memory bank to be refreshed is turned into a don't-care state, and thus memory cells in a plurality of regions (for example, two regions) of the first memory bank are selected. Accordingly, the number of memory cells corresponding to two times (2*a) of the reference number is refreshed. In this case, the average number of the memory cells being refreshed according to each refresh control signal C_Ref in one refresh cycle may correspond to a multiple in an integer value of the reference number. For example, the average number of memory cells being refreshed according to each refresh control signal C_Ref may be 2*a.

A graph of FIG. 2C shows an example where different numbers of memory cells are refreshed according to each refresh control signal C_Ref, specifically an example where a refresh cycle is more precisely controlled. In the graph of FIG. 2C, one memory bank (for example, the first memory bank) is described as an example, and other memory banks may be refreshed in the same or similar manner as the first memory bank. Unlike the example of the graph of FIG. 2B, a time interval of don't-care processing at least one bit of a refresh address is largely set, for example, one don't-care conversion is performed per three refresh control signals C_Ref. For example, in the embodiment of the graph of FIG. 2C, the average number of memory cells being refreshed according to each refresh control signal C_Ref may be 1.33*a. Here, the average number of memory cells being refreshed according to each refresh control signal C_Ref may be further reduced compared to the example of the graph of FIG. 2B.

Figure 3:
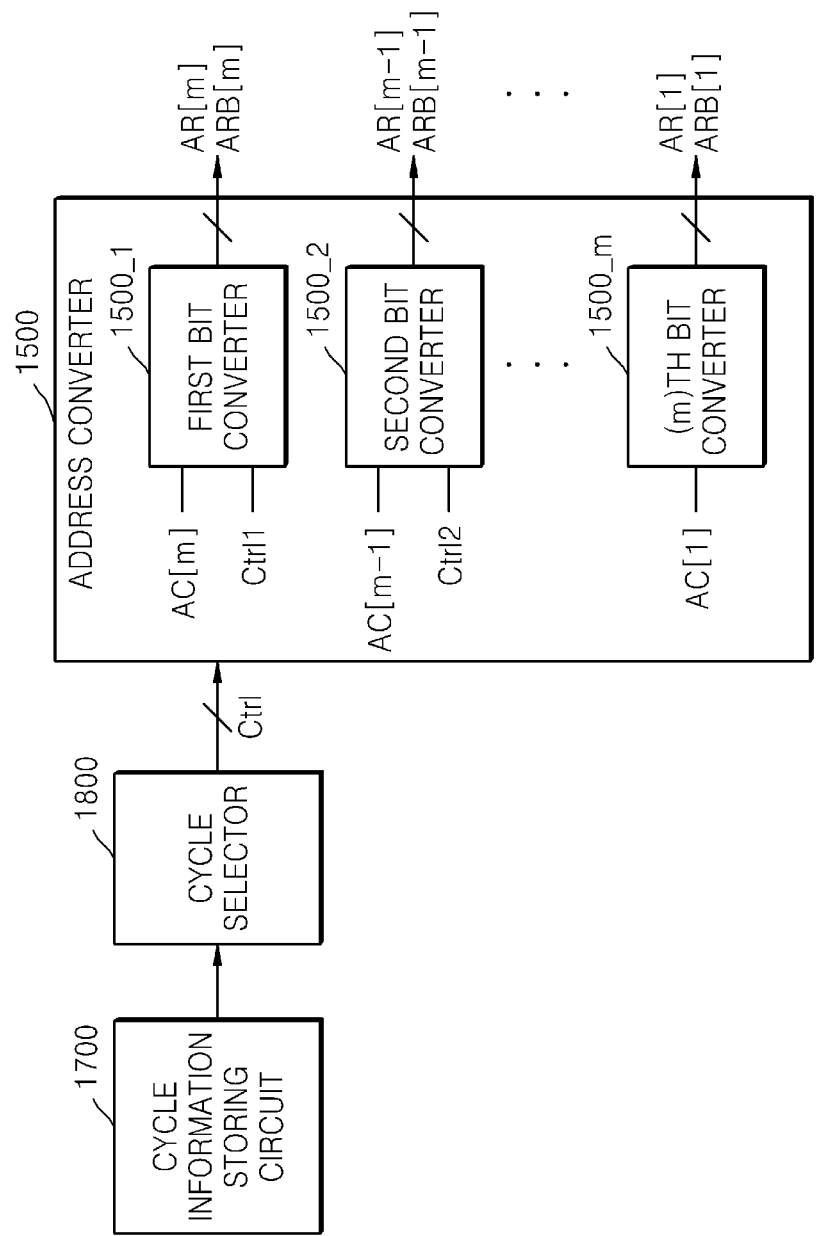
FIG. 3 is a block diagram of an address converter of FIG. 1, according to an embodiment.

FIG. 3 is a block diagram of the address converter 1500 of FIG. 1, according to an embodiment. For convenience of description, FIG. 3 further illustrates the cycle information storing circuit 1700 and the cycle selector 1800 besides the address converter 1500.

The cycle information storing circuit 1700 may be realized as any one of various circuits storing information in a non-volatile manner. For example, as shown in FIG. 3, the cycle information storing circuit 1700 may include a MRS or a fuse unit (e.g., a regular fuse or an anti-fuse). An electric fuse programmable by a user may be used as the fuse unit, or alternatively, when the cycle information storing circuit 1700 is realized as a MRS, cycle information may be set and converted according to an input of the user.

The cycle selector 1800 generates the cycle select signal Ctrl in response to the refresh cycle information from the cycle information storing circuit 1700. The cycle select signal Ctrl includes at least one control signal, and for example, the cycle select signal Ctrl may include first and second control signals Ctrl1 and Ctrl2 when two bits included in the counting signal Add_cnt controls whether to perform a don't-care process. When another number of bits of the counting signal Add_cnt controls whether to perform a don't-care process, the cycle select signal Ctrl may include another number of control signals.

The address converter 1500 includes at least one bit converter, and for example, the address converter 1500 may include first through (m)th bit converters 1500_1 through 1500_m when the counting signal Add_cnt includes m bits. The first through (m)th bit converters 1500_1 through 1500_m respectively receive the m bits of the counting signal Add_cnt. The first bit converter 1500_1 may receive an (m)th bit AC[m] as a most significant bit of the counting signal Add_cnt and the (m)th bit converter 1500_m may receive a first bit AC[1] as a least significant bit of the counting signal Add_cnt.

While converting at least one bit of the counting signal Add_cnt, control signals (for example, the first and second control signals Ctrl1 and Ctrl2) from the cycle selector 1800 may be used. During a bit converting operation, at least one bit of the counting signal Add_cnt may be or may not be don't-care processed. When don't-care processing on two most significant bits of the counting signal Add_cnt is controlled, the first bit converter 1500_1 receives the (m)th bit AC[m] and controls whether to don't-care process the (m)th bit AC[m] in response to the first control signal Ctrl1. For example, when the first control signal Ctrl1 is in a first logic state, the first bit converter 1500_1 don't-care processes the (m)th bit AC[m], and when the first control signal Ctrl1 is in a second logic state, the first bit converter 1500_1 does not don't-care process the (m)th bit AC[m]. When the (m)th bit AC[m] is don't-care processed, complementary outputs AR[m] and ARB[m] corresponding to the (m)th bit AC[m] are in the same state. On the other hand, when the (m)th bit AC[m] is not don't-care processed, the complementary outputs AR[m] and ARB[m] corresponding to the (m)th bit AC[m] are in different states. The complementary outputs AR[m] and ARB[m] include information corresponding to any one bit of the refresh address Add-Ref.

Similarly, the second bit converter 1500_2 receives a (m−1)th bit AC[m−1] and controls whether to don't-care process the (m−1)th bit AC[m−1] in response to the second control signal Ctrl2. When the (m−1)th bit AC[m−1] is don't-care processed, complementary outputs AR[m−1] and ARB[m−1] corresponding to the (m−1)th bit AC[m−1] are in the same state. On the other hand, when the (m−1)th bit AC[m−1] is not don't-care processed, the complementary outputs AR[m−1] and ARB[m−1] are in different states.

For example, when the refresh address Add_Ref includes information corresponding to 6 bits and only a don't-care state of the (m)th bit AC[m] of the counting signal Add_cnt is controlled, a region of the memory cell array 1110 assigned by the refresh address Add_Ref is changed according to the don't-care state of the (m)th bit AC[m]. In other words, when the (m)th bit AC[m] is not don't-care processed, a memory cell in any one of 64 regions may be refreshed based on the 6-bit information of the refresh address Add-Ref. On the other hand, when the (m)th bit AC[m] is don't-care processed, a region is selected only based on information of remaining bits of the refresh address Add_Ref regardless of the (m)th bit AC[m], and thus memory cells in two of 64 regions may be refreshed. In other words, by controlling whether to don't-care process at least one bit of the refresh address Add_Ref, the number of memory cells to be refreshed may be controlled by one refresh control signal.

Figure 4:
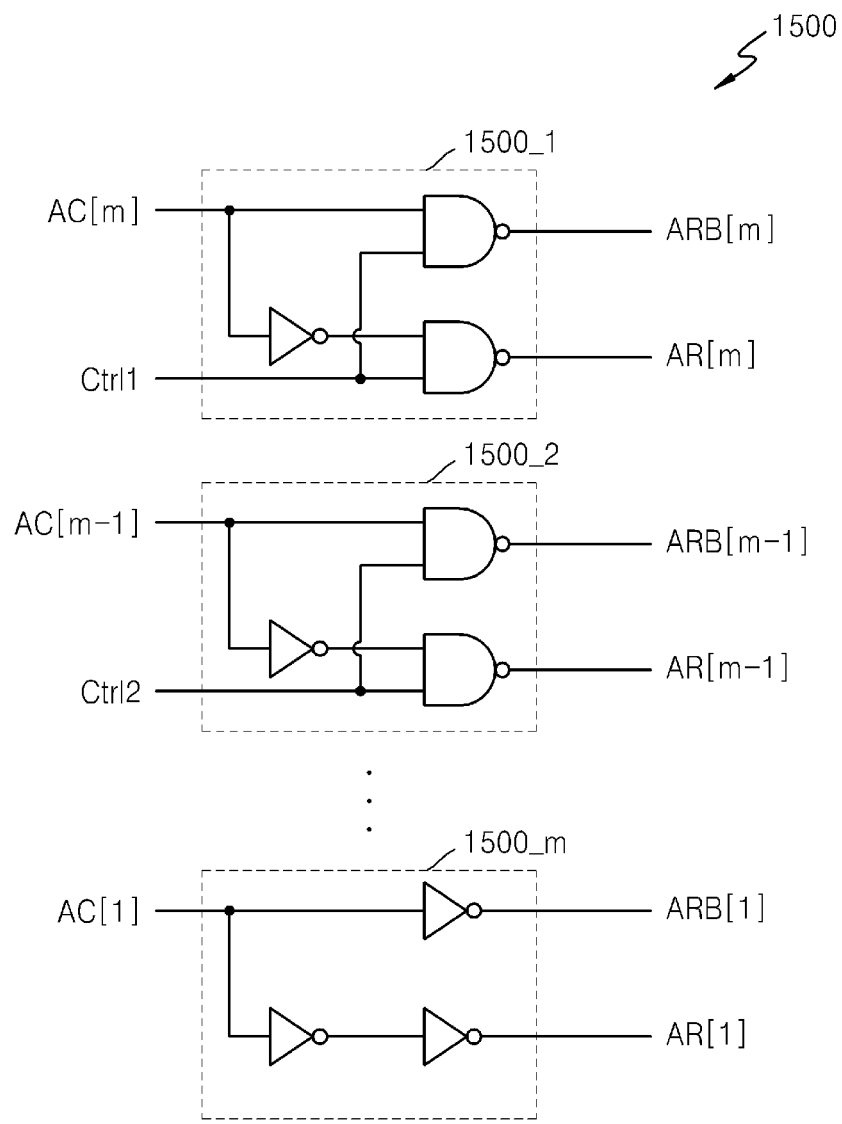
FIG. 4 is a circuit diagram of the address converter of FIG. 3, according to an embodiment.

FIG. 4 is a circuit diagram of the address converter 1500 of FIG. 3, according to an embodiment. As shown in FIG. 4, the address converter 1500 may include the first through (m)th bit converters 1500_1 through 1500_m. Also, each of the first through (m)th bit converters 1500_1 through 1500_m may include at least one logic element. For example, when the first bit converter 1500_1 performs a converting operation of controlling whether to don't-care process in response to the cycle select signal Ctrl from the cycle selector 1800, the first bit converter 1500_1 may include at least one logic element (for example, a NAND gate) receiving the first control signal Ctrl1, besides an inverter. On the other hand, the (m)th bit converter 1500_m may include one or more inverters for generating complementary outputs (AR[1] and ARB[1]) by using a corresponding bit without controlling whether to don't-care process the corresponding bit of the counting signal Add_cnt. The complementary outputs AR[1] and ARB[1] through AR[m] and ARB[m] of the address converter 1500 are provided as the refresh addresses Add_Ref.

An address converting operation according to the first and second control signals Ctrl1 and Ctrl2 will now be described with reference to the first bit converter 1500_1.

When the first control signal Ctrl1 is in a first logic state (for example, logic low), the first bit converter 1500_1 generates the complementary outputs AR[m] and ARB[m] in the same state (for example, logic high) regardless of a logic state of the (m)th bit AC[m] of the counting signal Add_cnt. The complementary outputs AR[m] and ARB[m] of the first bit converter 1500_1 are information about an (m)th bit of the refresh address Add_Ref and are provided to the row decoder 1120 of FIG. 1. As the (m)th bit of the refresh address Add_Ref is don't-care processed, memory cells in at least two regions are refreshed.

On the other hand, when the first control signal Ctrl1 is in a second logic state (for example, logic high), the first bit converter 1500_1 generates the complementary outputs AR[m] and ARB[m] corresponding to a logic state of the (m)th bit AC[m] of the counting signal Add_cnt. For example, when the (m)th bit AC[m] of the counting signal Add_cnt is in logic high, one output AR[m] of the complementary outputs is in logic high and the other output ARB[m] of the complementary outputs is in logic low. The complementary outputs AR[m] and ARB[m] in different states are provided to the row decoder 1120, and memory cells in any one region corresponding to the states of the complementary outputs AR[m] and ARB[m] are refreshed.

Figure 5:
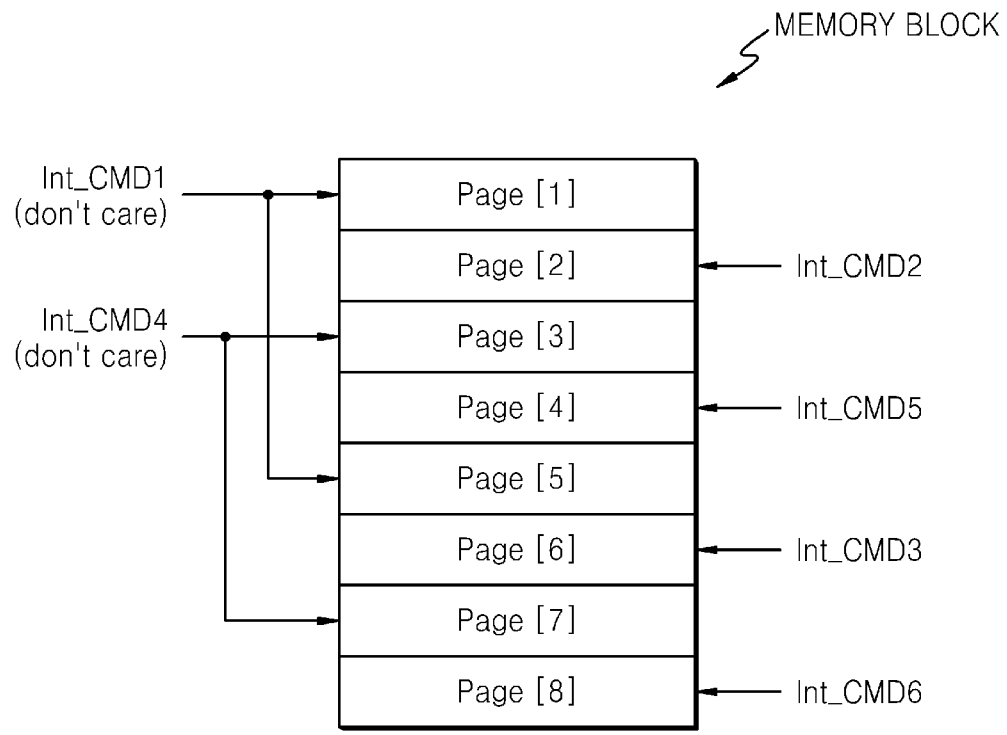
FIG. 5 is a block diagram for describing an order of memory cells being refreshed in one refresh cycle, according to an embodiment.

FIG. 5 is a block diagram for describing an order of memory cells being refreshed in one refresh cycle, according to an embodiment. For convenience of description, FIG. 5 illustrates an example of one memory block including 8 pages. However, more pages may be included in the memory block and it is obvious that a memory bank including a plurality of memory blocks may be refreshed in the same or similar manner based on the example of FIG. 5.

If the counting signal Add_cnt has 3 bits, a first internal refresh command Int_CMD1 is generated in response to an external command (or an internal clock signal) as one refresh cycle is started. The counting signal Add_cnt is generated according to a first refresh control signal responding to the first internal refresh command Int_CMD1.

The counting signal Add_cnt may first have a '000' value, and a most significant bit of the counting signal Add_cnt is don't-care processed according to an address converting operation. Accordingly, pages corresponding to an address 'x00' are selected and for example, memory cells in first and fifth pages Page[1] and Page[5] are refreshed.

Then, a second internal refresh command Int_CMD2 is generated in response to a following command, and the counting signal Add_cnt having a '001' value is generated. Also, the most significant bit of the counting signal Add_cnt is not don't-care processed during an address converting operation, and thus a page corresponding to an address '001' is selected and for example, memory cells in a second page Page[2] are refreshed.

Then, a third internal refresh command Int_CMD3 is generated in response to a following command, and the counting signal Add_cnt having a '101' value is generated by counting a bit corresponding to a most significant bit. Also, the most significant bit of the counting signal Add_cnt is not don't-care processed during an address converting operation, and thus a page corresponding to an address '101' is selected and for example, memory cells in a sixth page Page[6] are refreshed.

Meanwhile, a fourth internal refresh command Int_CMD4 is generated in response to a following command, and the counting signal Add_cnt having a '010' value may be generated by performing a counting operation on least and most significant bits. Also, the most significant bit of the counting signal Add_cnt is don't-care processed during an address converting operation. Accordingly, pages corresponding to address 'x10' are selected and for example, memory cells in third and seventh pages Page[3] and Page[7] are refreshed.

Next, fifth and sixth internal refresh commands Int_CMD5 and Int_CMD 6 are sequentially generated in response to a following command. A counting operation is performed by a refresh control signal generated according to the fifth internal refresh command Int_CMD5, and memory cells in a fourth page Page[4] are refreshed without generating a don't-care bit with respect to the generated counting signal Add_cnt. Also, memory cells in an eighth page Page[8] are refreshed by a refresh control signal generated according to the sixth internal refresh command Int_CMD6.

According to the embodiment shown in FIG. 5, while refreshing a plurality of regions in a memory cell array, the number of memory cells to be refreshed per refresh control signal may be increased or decreased in decimal point units instead of multiple units. For example, while refreshing all memory cells of 8 pages in FIG. 5, memory cells are all refreshed by 6 refresh control signals instead of 8 (×1 times) refresh control signals (or internal refresh commands) or 4 (×2 times) refresh control signals. In other words, when all memory cells are refreshed by 8 (×1 times) refresh control signals, and a refresh cycle thereof is defined to be 64 ms (reference cycle), the refresh cycle may be controlled to a multiple of decimal point units of the reference cycle instead of an integer multiple (such as 64 ms, 32 ms, 128 ms) of the reference cycle according to the embodiment of FIG. 5.

In other words, when a memory cell array includes 2*n regions and a refresh cycle where all memory cells of the memory cell array are refreshed by 2*n refresh control signals is defined to be a reference cycle, all memory cells of the memory cell array may be refreshed by less than 2*n refresh control signals according to an embodiment of the inventive concept.

Alternatively, the embodiment of the disclosure may be described as follows in terms of the average number of memory cells that are refreshed by each refresh control signal in one refresh cycle. When it is assumed that a memory cells of a memory cell array are selected by one refresh address that is not in a don't-care state in a reference refresh cycle, according to an embodiment, the average number of memory cells being refreshed by one refresh control signal in one refresh cycle may have a value excluding an integer multiple of a. In other words, as described above, while controlling a refresh cycle, the average number of memory cells being refreshed per refresh control signal may be controlled to a multiple in decimal point units of a (such as 1.25*a or 1.5*a) besides an integer multiple of a (such as 2*a or 3*a).

In the embodiment of FIG. 5, don't-care processing of the most significant bit of the counting signal Add_cnt is controlled, wherein the don't-care processing may be controlled on other bits of the counting signal Add_cnt. In other words, an order of pages being refreshed in one memory block may vary by differently setting a counting operation or an operation of controlling don't-care processing of the counting signal Add_cnt.

Figure 6:
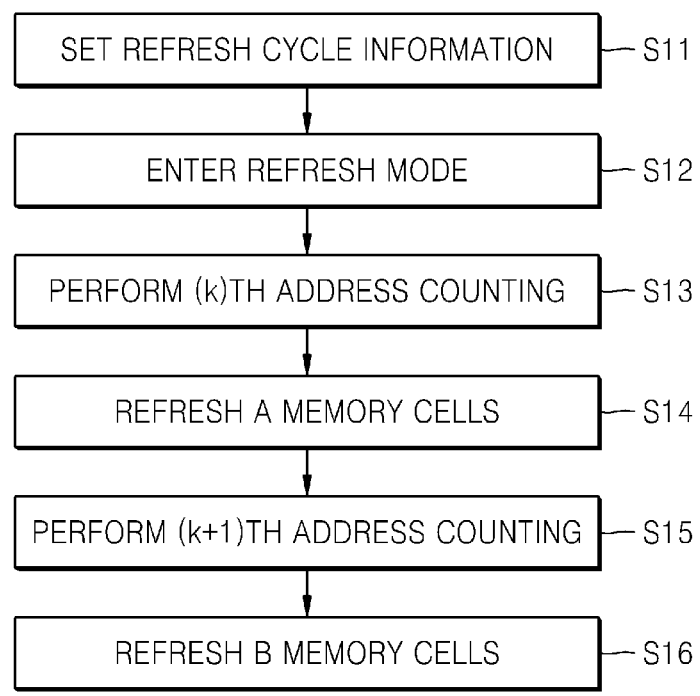
FIG. 6 is a flowchart illustrating a method of operating a semiconductor memory device, according to an embodiment.

FIG. 6 is a flowchart illustrating a method of operating a semiconductor memory device, according to an embodiment.

As shown in FIG. 6, refresh cycle information is set and stored in a storing circuit in the semiconductor memory device in operation S11. The refresh cycle information may be stored through a unit fixably storing information by using a metal line or a laser fuse, or through a unit capable of setting and changing information by a user by using an electric fuse or register set.

The semiconductor memory device enters a refresh mode in response to reception of an outer refresh command in operation S12. By entering a refresh mode, a counting signal for designating a region to be refreshed is generated by a counter included in the semiconductor memory device. A counting operation may be performed in response to the external refresh command or by a circuit that generates a clock signal, such as an oscillator in the semiconductor memory device. According to the counting operation, (k)th address counting is performed and thus a counting signal is generated, in operation S13.

An address converting operation is performed on the counting signal in the same or similar manner described above, and the address converting operation may include an operation of controlling whether to don't-care process at least one bit of the counting signal. At least one bit of the counting signal according to the (k)th address counting is don't-care processed, some regions of a memory cell array are selected in response to a refresh address where at least one bit is don't-care processed, and A number of memory cells included in the selected regions are refreshed, in operation S14.

Then, a counting operation is performed in response to a following refresh command (or a following clock signal). According to the counting operation, (k+1)th address counting is performed and thus a counting signal is generated in operation S15. An address converting operation for generating a don't-care bit is not performed on the counting signal according to the (k+1)th address counting, and thus other some regions of the memory cell array are selected in response to a refresh address that is not in a don't-care state. Accordingly, B number of memory cells are refreshed in operation S16, wherein A and B have different values.

Figure 7A:
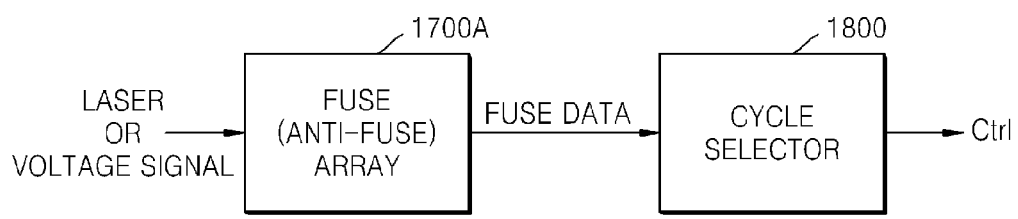
FIG. 7A and FIG. 7B are block diagrams of a cycle information storing circuit of FIG. 1 according to embodiments.
Figure 7B:
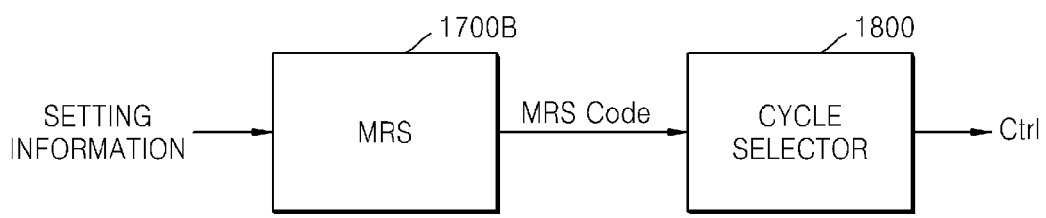

FIGS. 7A and 7B are block diagrams of the cycle information storing circuit 1700 of FIG. 1 according to embodiments.

In a diagram of FIG. 7A, the cycle information storing circuit 1700 is realized as a fuse array or anti-fuse array 1700A. The fuse array or anti-fuse array 1700A may include a plurality of fuses or anti-fuses disposed in an array form. As described above, when a fuse or anti-fuse is programmed by laser beam, refresh cycle information may be stored in a non-volatile manner. Alternatively, when the fuse or anti-fuse is programmed by an electric signal (for example, a high voltage signal), refresh cycle information may be stored in a non-volatile manner by an input of a user.

The refresh cycle information stored in the fuse array or anti-fuse array 1700A is provided to the cycle selector 1800, in a fuse data form. The cycle selector 1800 generates a cycle select signal Ctrl including at least one control signal in response to fuse data including the refresh cycle information.

Meanwhile, in a diagram of FIG. 7B, the cycle information storing circuit 1700 is realized as an MRS 1700B. The MRS 1700B may be an MRS for storing operation mode information included in a semiconductor memory device. The MRS 1700B further stores refresh cycle information according to an embodiment besides the operation mode information, and the refresh cycle information may be stored in the MRS 1700B according to setting information input by a user. During an initial operation of the semiconductor memory device, the refresh cycle information is provided to the cycle selector 1800 in a form of an MRS code from the MRS 1700B. The cycle selector 1800 generates a cycle select signal Ctrl including at least one control signal in response to the MRS code including the refresh cycle information.

Figure 8:
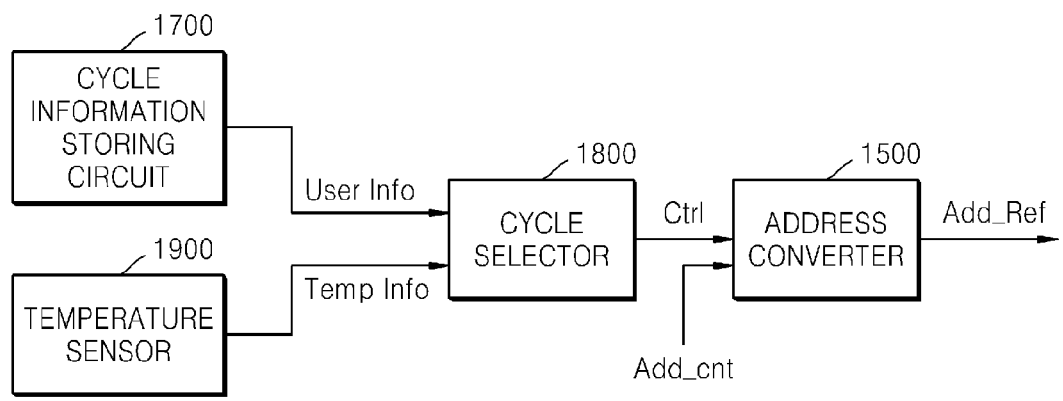
FIG. 8 is a block diagram for describing an address converting operation using temperature information of a semiconductor memory device, according to an embodiment.

FIG. 8 is a block diagram for describing an address converting operation using temperature information of a semiconductor memory device 1000 of FIG. 1, according to an embodiment.

As shown in FIG. 8, the semiconductor memory device 1000 according to an embodiment further includes a temperature sensor 1900 besides the cycle information storing circuit 1700, the cycle selector 1800, and the address converter 1500 described above. Temperature information Temp Info output from the temperature sensor 1900 may be used in relation to control of various operations, such as changing an operation voltage of the semiconductor memory device 1000. According to an embodiment, the temperature information Temp Info is provided to the cycle selector 1800 so as to change a refresh cycle according to the temperature information Temp Info.

The cycle information storing circuit 1700 stores refresh cycle information for refreshing the semiconductor memory device 1000 in a non-volatile manner, and for example, may store information settable and changeable by a user. The cycle selector 1800 generates a cycle select signal Ctrl by using the temperature information Temp Info from the temperature sensor 1900 and cycle information User Info set by the user as the refresh cycle information. As described above, the cycle select signal Ctrl may include at least one control signal.

Don't-care processing of at least one bit of a counting signal Add_cnt is controlled by the at least one control signal included in the cycle select signal Ctrl, and the number of memory cells to be refreshed is controlled in response to one refresh control signal. The cycle select signal Ctrl is generated by the temperature information Temp Info, and thus an optimized refresh cycle may be set according to a result of measuring a temperature inside the semiconductor memory device 1000.

For example, when the temperature inside the semiconductor memory device 1000 is increased, memory cells may be more frequently refreshed, and thus the refresh cycle may be set short as the temperature inside the semiconductor memory device 1000 is increased. The cycle select signals Ctrl having different values are output according to the temperature information Temp Info, and thus the number of don't-care processing one or more bits of the counting signal Add_cnt is increased. In this case, the refresh cycle may be set short since the average number of memory cells being refreshed per one refresh control signal in one refresh cycle may be increased and a time taken to refresh all memory cells may be reduced.

On the other hand, when the temperature inside the semiconductor memory device 1000 is decreased, the refresh cycle may be set long. The cycle selector 1800 generates the cycle select signal Ctrl according to the temperature information Temp Info, and provides the cycle select signal Ctrl to the address converter 1500. As the temperature inside the semiconductor memory device 1000 is decreased, the number of don't-care processing one or more bits of the counting signal Add_cnt is decreased, and thus the average number of memory cells being refreshed per refresh control signal in one refresh cycle may be decreased. The refresh cycle may be increased according to a decreasing rate of the average number of memory cells being refreshed per refresh control signal.

Figure 9A:
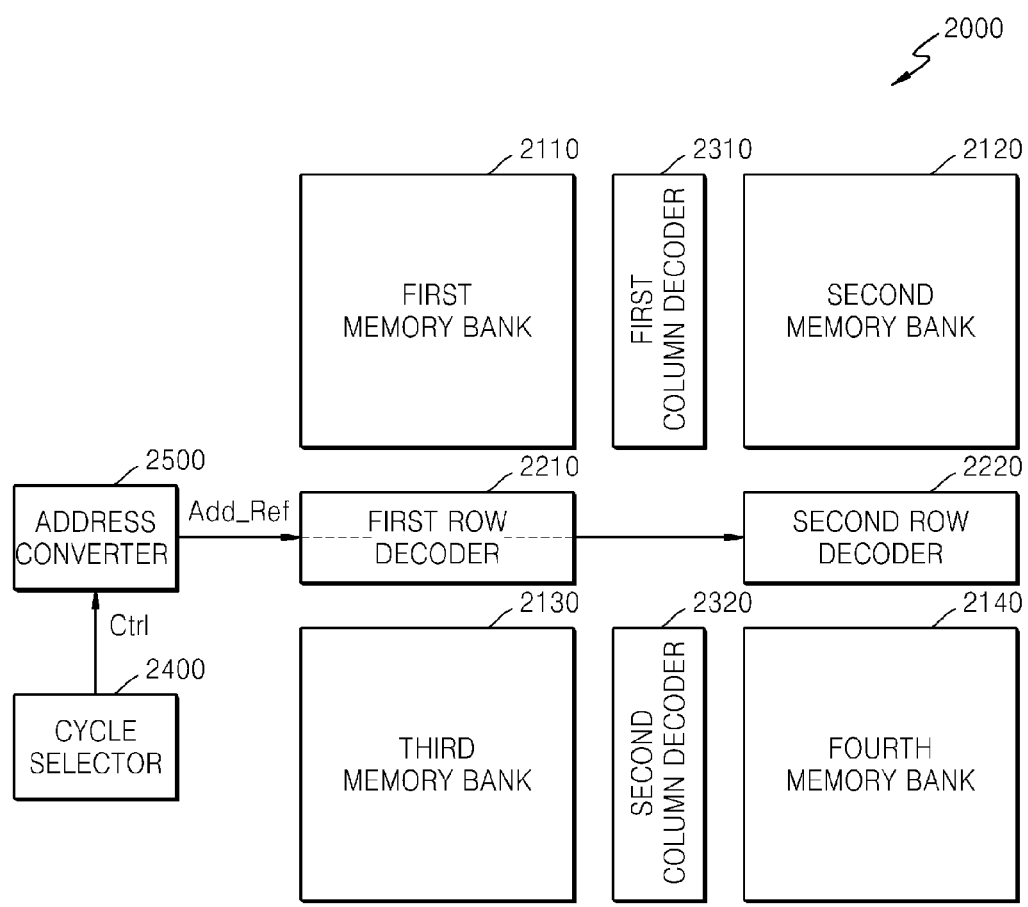
FIGS. 9A and 9B are block diagrams for describing a semiconductor memory device according to an embodiment.
Figure 9B:
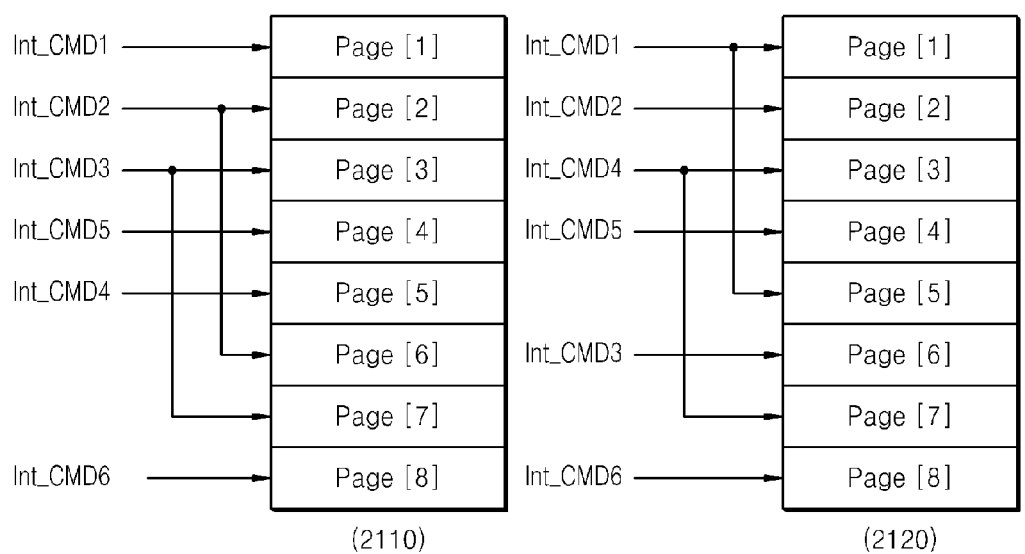

FIGS. 9A and 9B are block diagrams for describing a semiconductor memory device 2000 according to one embodiment. In FIG. 9A, first through fourth memory banks 2110 through 2140 are included in the semiconductor memory device 2000 as a plurality of memory banks.

As shown in FIG. 9A, the semiconductor memory device 2000 includes a memory cell array including the first through fourth memory banks 2110 through 2140 and a peripheral circuit region for driving the memory cell array. In order to drive the memory cell array, first and second row decoders 2210 and 2220 and first and second column decoders 2310 and 2320 may be included in the semiconductor memory device 2000, and in order to control a refresh operation on the memory cell array, a cycle selector 2400 and an address converter 2500 may be included in the semiconductor memory device 2000. The refresh operation will now be described with reference to the first and second memory banks 2110 and 2120.

The address converter 2500 generates a refresh address Add_Ref by performing an address converting operation on at least one bit of a counting signal (not shown) based on a cycle select signal Ctrl from the cycle selector 2400. The refresh address Add_Ref may be commonly provided to the first row decoder 2210 for driving the first memory bank 2110 and the second row decoder 2220 for driving the second memory bank 2120.

According to an embodiment, different numbers of memory cells of the first and second memory banks 2110 and 2120 may be refreshed in response to any one of refresh control signals or any one of refresh addresses Add_Ref. For example, memory cells included in one page of the first memory bank 2110 may be refreshed whereas memory cells included in two pages of the second memory banks 2120 may be refreshed in response to the refresh address Add_Ref commonly provided to the first and second memory banks 2110 and 2120.

Each of the first and second row decoders 2210 and 2220 receives and decodes the refresh address Add_Ref to select a region to be refreshed. Each bit of the refresh address Add_Ref has complementary outputs, and at least one bit of the refresh address Add_Ref may be in a don't-care state according to a result of the address converting operation. The first row decoder 2210 and/or the second row decoder 2220 may include a logic element (not shown) for changing at least one value of the complementary outputs, and may control the number of memory cells to be refreshed in each memory bank by selectively driving the logic element during a refresh operation.

FIG. 9B illustrates an example where memory cells of the first and second memory banks 2110 and 2120 are refreshed. As shown in FIG. 9B, in the first memory bank 2110, memory cells in two pages are simultaneously refreshed as a don't-care state is applied when second and third internal refresh commands Int_CMD2 and Int_CMD3 or refresh control signals Ctrl2 and Ctrl3 are generated whereas in the second memory bank 2120, memory cells in two pages are simultaneously refreshed as a don't-care state is applied when first and fourth internal refresh commands or Int_CMD1 and Int_CMD4 or refresh control signals Ctrl1 and Ctrl4 are generated.

Figure 10:
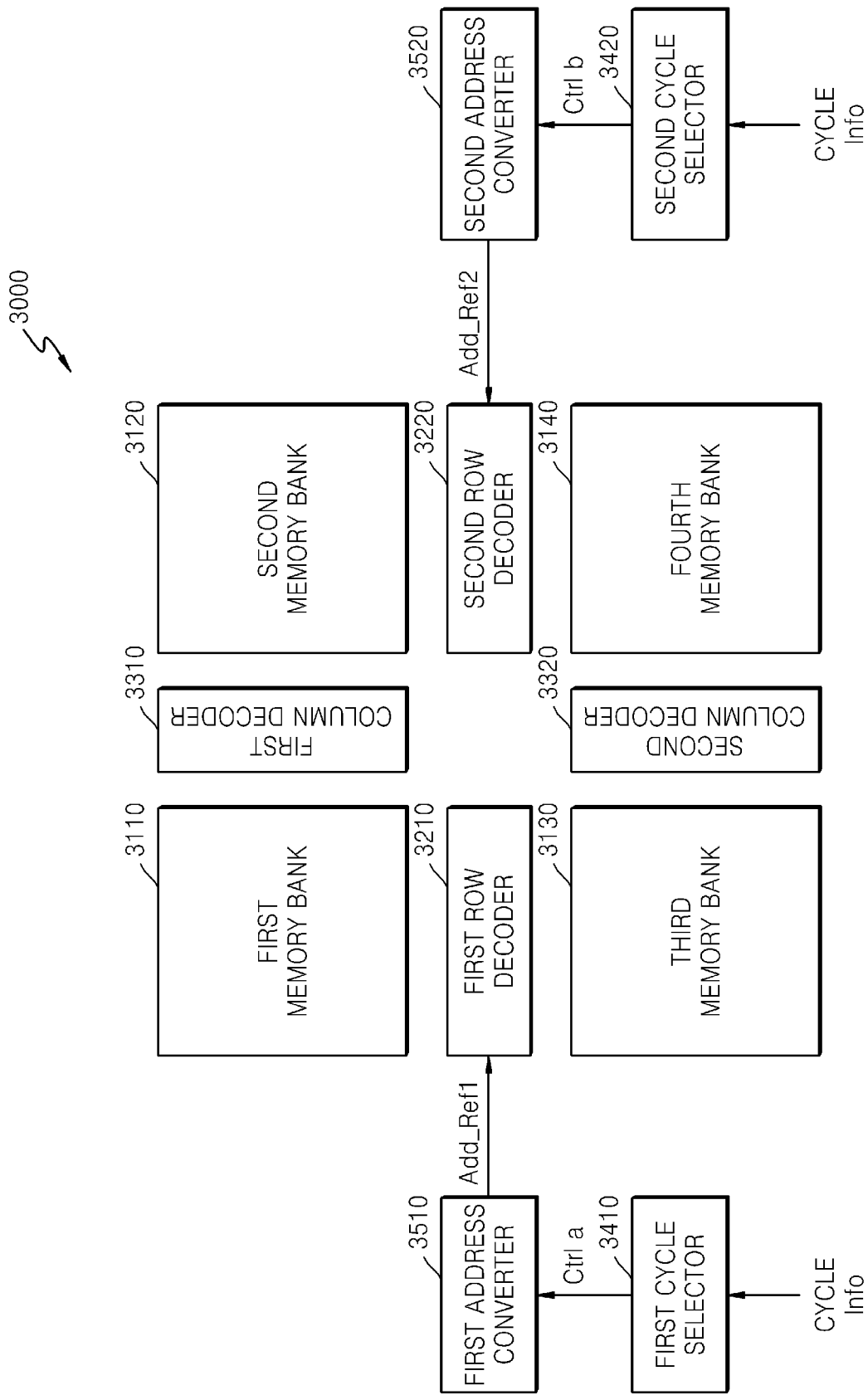
FIG. 10 is a block diagram of a semiconductor memory device according to an embodiment.

FIG. 10 is a block diagram of a semiconductor memory device 3000 according to one embodiment. In FIG. 10, a plurality of first and second cycle selectors 3410 and 3420 and a plurality of first and second address converters 3510 and 3520 are included in the semiconductor memory device 3000 to drive each memory bank.

As shown in FIG. 10, the semiconductor memory device 3000 includes a memory cell array including first through fourth memory banks 3110 through 3140, and first and second row decoders 3210 and 3220 and first and second column decoders 3310 and 3320 for driving the memory cell array. The first row decoder 3210 may drive at least one memory bank, for example, the first and third memory banks 3110 and 3130. Also, the second row decoder 3220 may drive at least one memory bank, for example, the second and fourth memory banks 3120 and 3140.

In order to refresh different numbers of memory cells according to memory banks with respect to one refresh control signal, at least two cycle selectors and address converters may be included in the semiconductor memory device 3000. For example, the first and second cycle selectors 3410 and 3420 and the first and second address converter 3510 and 3520 may be included in the semiconductor memory device 3000. Refresh cycle information Cycle Info may be provided to each of the first and second cycle selectors 3410 and 3420, and the first and second cycle selectors 3410 and 3420 may generate different cycle control signals Ctrl a and Ctrl b in response to the refresh cycle information Cycle Info.

The first address converter 3510 generates a first refresh address Add_Ref1 in response to the cycle control signal Ctrl a from the first cycle selector 3410 and the second address converter 3520 generates a second refresh address Add_Ref2 in response to the cycle control signal Ctrl b from the second cycle selector 3420. Referring to the first and second memory banks 3110 and 3120, different numbers of memory cells of the first and second memory banks 3110 and 3120 may be refreshed per refresh control signal by differently setting a timing when a don't-care state is applied even when refresh cycles are the same.

Meanwhile, according to the current embodiment, a refresh operation may be performed according to different refresh cycles in each memory bank. For example, refresh cycle information Cycle Info having different values may be provided to the first and second cycle selectors 3410 and 3420, and the first and second cycle selectors 3410 and 3420 generate the cycle control signals Ctrl a and Ctrl b according to the corresponding refresh cycle information Cycle Info. For example, when a refresh cycle of the first memory bank 3110 is smaller than a refresh cycle of the second memory bank 3120, at least one bit of the first refresh address Add_Ref1 may be frequently in a don't-care state such that the average number of memory cells of the first memory bank 3110 being refreshed per refresh control signal in one refresh cycle is higher than that of the second memory bank 3120.

Figure 11:
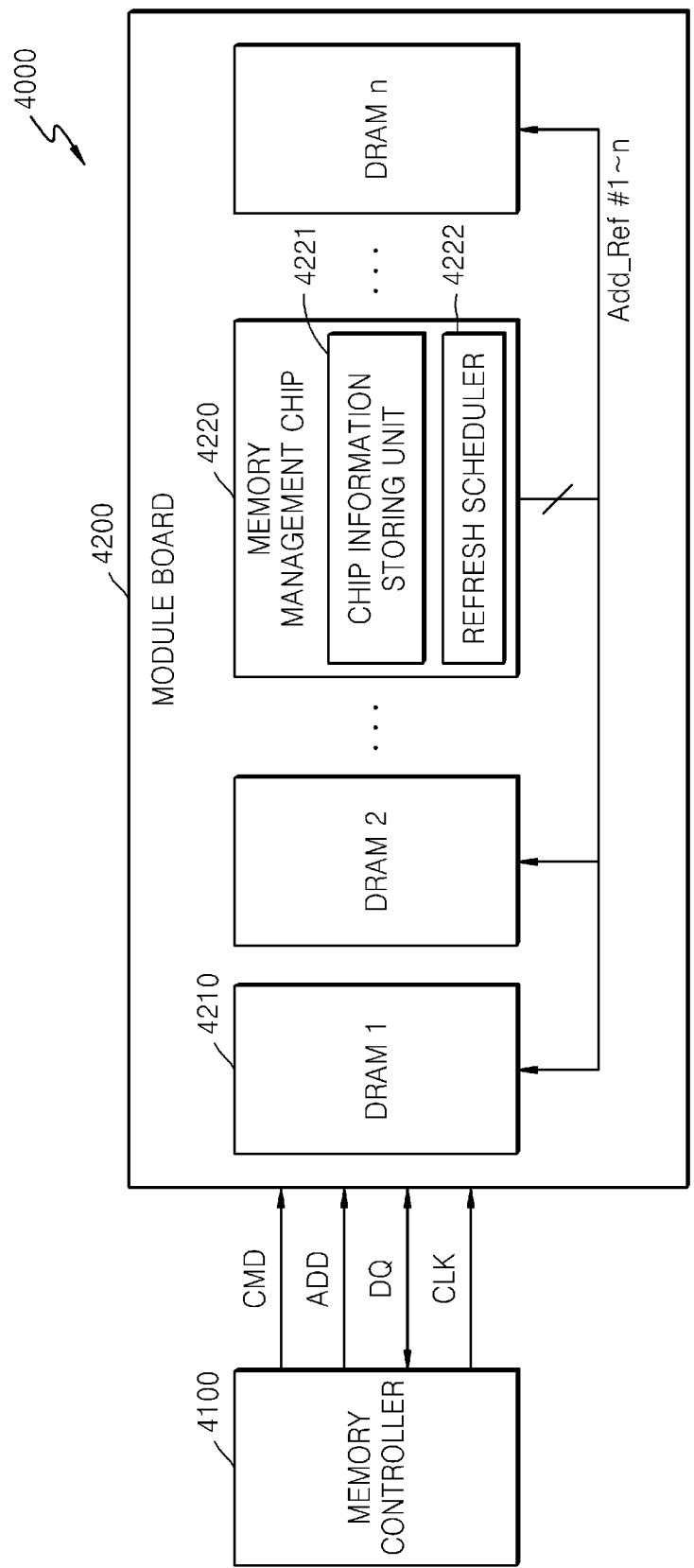
FIG. 11 is a block diagram of a memory module and a memory system, according to an embodiment.

FIG. 11 is a block diagram of a memory module 4200 and a memory system 4000, according to an embodiment. As shown in FIG. 11, according to an embodiment, the memory system 4000 includes a memory controller 4100 and the memory module 4200. Also, the memory module 4200 includes one or more semiconductor memory devices 4210 provided on a module board, wherein the semiconductor memory device 4210 may be a dynamic random access memory (DRAM) chip. Also, a memory management chip 4220 for managing a memory operation of the semiconductor memory device 4210 may be further provided on the module board.

The memory controller 4100 provides various signals, for example, a command/address CMD/ADD and a clock signal CLK, for controlling the semiconductor memory device 4210 included in the memory module 4200, and provides or receives a data signal DQ to or from the semiconductor memory device 4210 by communicating with the memory module 4200. The memory management chip 4220 manages a memory operation of the semiconductor memory device 4210, and also manages a refresh operation according to an embodiment of the inventive concept. In order to manage a refresh operation, the memory management chip 4220 may include a chip information storing unit 4221 and a refresh scheduler 4222.

The chip information storing unit 4221 stores memory characteristic information in a non-volatile manner, and as described above, may be realized in a fuse array using a fuse or anti-fuse. The chip information storing unit 4221 may store refresh cycle information of the semiconductor memory device 4210 as one of various pieces of memory characteristic information. As described above, the refresh cycle information may be fixably stored in the chip information storing unit 4221 or may be settably or changeably stored by a user.

The refresh scheduler 4222 manages the refresh operation of the semiconductor memory device 4210. For example, the refresh scheduler 4222 generates a counting signal in response to an outer refresh command or an internal clock signal generated during a self refresh mode, and converts at least one bit of the counting signal based on the refresh cycle information in the same or similar manner described above. Accordingly, refresh addresses Add_Ref#1-n are generated according to the semiconductor memory devices 4210, and are provided to the corresponding semiconductor memory devices 4210. As described above, a refresh cycle of each semiconductor memory device 4210 may be controlled. Alternatively, different numbers of memory cells may be refreshed per refresh control signal according to the semiconductor memory devices 4210 or a refresh operation may be performed according to different refresh cycles for each semiconductor memory device 4210.

Meanwhile, in the embodiment of FIG. 11, a signal is transferred between the memory controller 4100 and the memory module 4200, and between the semiconductor memory device 4210 and the memory management chip 4220 in the memory module 4200 through conductive lines, but an embodiment of the inventive concept is not limited thereto. For example, a signal may be transferred between the memory controller 4100 and the memory module 4200, between the semiconductor memory device 4210 and the memory management chip 4220, or between the plurality of semiconductor memory devices 4210 through an optical input/output (JO) connection. For example, a signal may be transferred by using a radiative method using radio frequency (RF) waves or ultrasonic waves, an inductive coupling method using magnetic induction, or a non-radiative method using magnetic resonance.

The radiative method is a method of transferring a signal wirelessly by using an antenna, such as a monopole or a planar inverted-F antenna (PIFA). Radiation is generated as electric fields or magnetic fields changing according to time affect each other, and a signal may be received according to a polarization characteristic of incident waves when there are antennas having the same frequency.

The inductive coupling method is a method of generating a strong magnetic field in one direction by winding up a coil several times and generating coupling by making coils resonating at similar frequencies to approach each other.

The non-radiative method is a method of using evanescent wave coupling for moving electromagnetic waves between two media resonating at the same frequency through a short-distance electromagnetic field.

Figure 12:
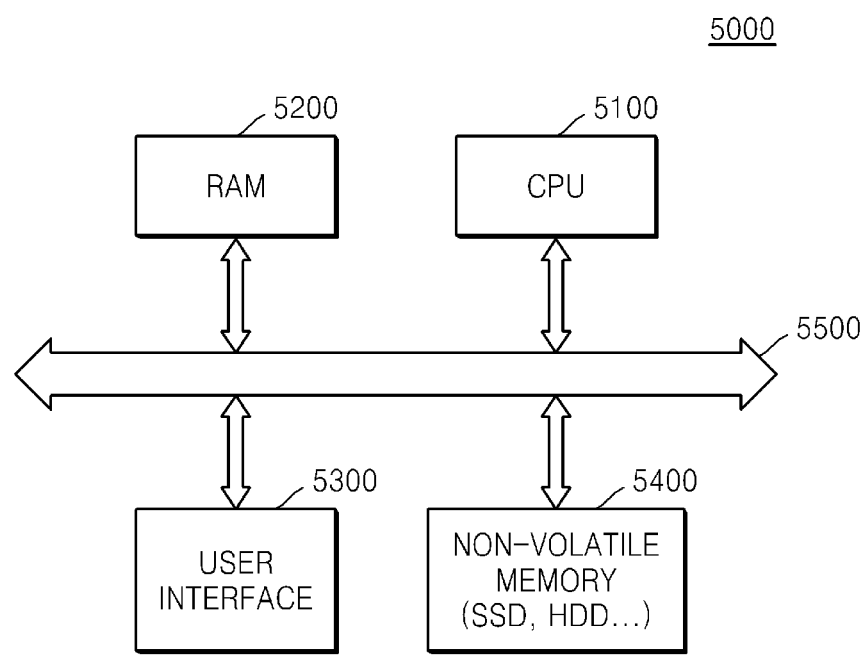
FIG. 12 is a block diagram of a computing system to which a semiconductor memory device is installed, according to an embodiment.

FIG. 12 is a block diagram of a computing system 5000 to which a semiconductor memory device is installed, according to an embodiment. A semiconductor memory device according to an embodiment may be installed as a random access memory (RAM) 5200 to an information processing system, such as a mobile device or a desktop computer. The semiconductor memory device installed as the RAM 5200 may be according to any one of the above embodiments described above. For example, the RAM 5200 may be a semiconductor memory device or a memory module according to the above embodiments. Alternatively, the RAM 5200 of FIG. 12 may have a concept of a memory system including a semiconductor memory device and a memory controller.

The computing system 5000 according to an embodiment includes a central processing unit (CPU) 5100, the RAM 5200, a user interface 5300, and a non-volatile memory 5400, wherein the CPU 5100, the RAM 5200, the user interface 5300, and the non-volatile memory 5400 are each electrically connected to a bus 5500. The non-volatile memory 5400 may be a large capacity storing unit, such as a solid state drive (SSD) or hard disk driver (HDD).

In the computing system 5000, the RAM 5200 may include a DRAM chip including a DRAM cell as a semiconductor memory device for storing data, as described in the above embodiments. Data may be temporarily stored in the RAM 5200 to operate the computing system 5000, and the RAM 5200 may periodically perform a refresh operation to maintain the data stored in the RAM 5200. While performing the refresh operation, a refresh cycle may be controlled while considering a memory characteristic (for example, a data retention characteristic) of the RAM 5200, wherein the refresh cycle may be controlled by controlling the number of memory cells being refreshed per refresh control signal.

Figure 13:
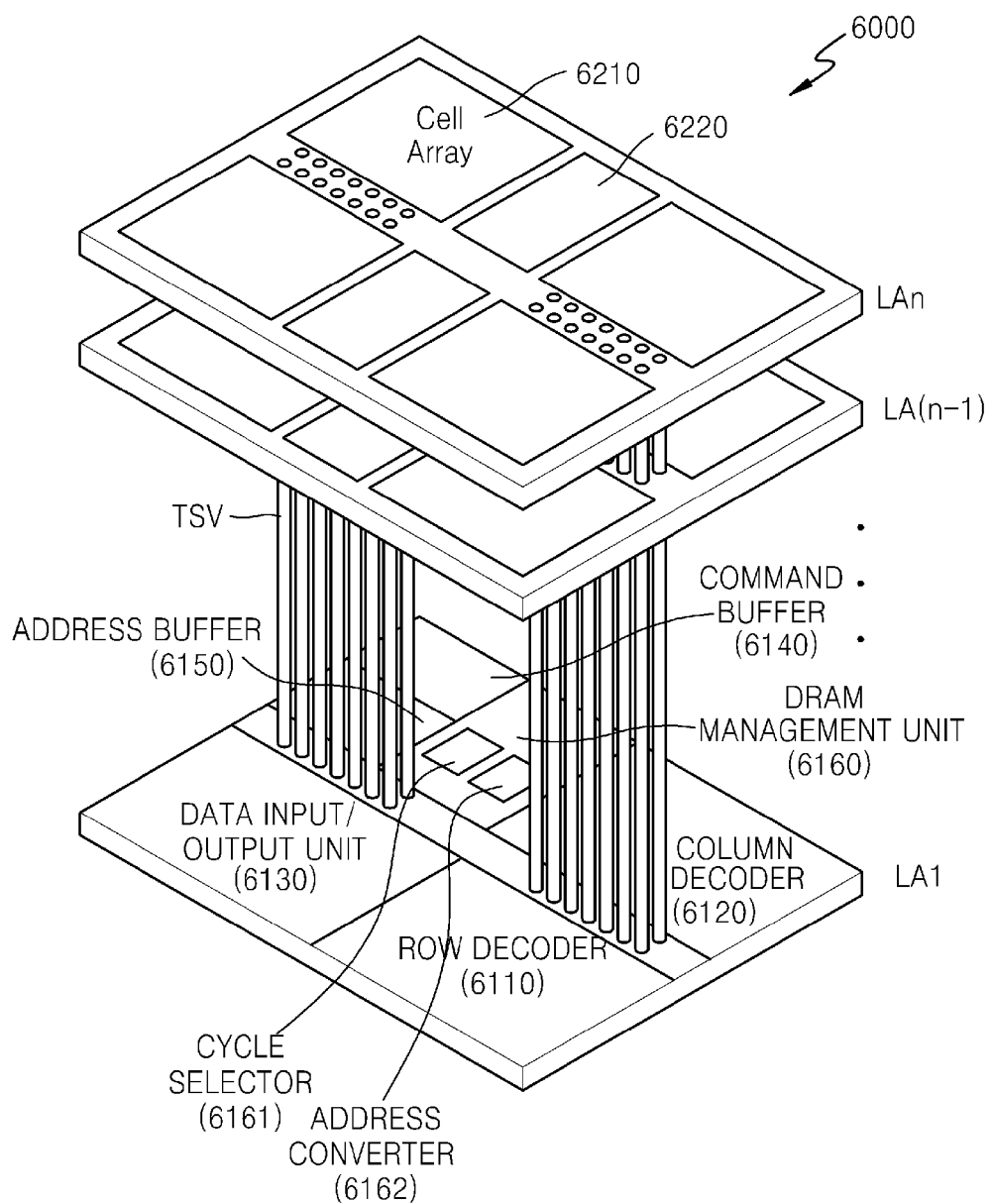
FIG. 13 is a structural diagram of a semiconductor memory device according to an embodiment.

FIG. 13 is a structural diagram of a semiconductor memory device 6000 according to one embodiment. As shown in FIG. 13, the semiconductor memory device 6000 may include a plurality of semiconductor layers LA1 through LAn. Each of the semiconductor layers LA1 through LAn may be a memory chip including a DRAM cell or some of the semiconductor layers LA1 through LAn may be master chips interfacing with an outer controller and the remainders may be slave chips storing data. In FIG. 13, it is assumed that the semiconductor layer LA1 located at the bottom is a master chip and the other semiconductor layers LA2 through LAn are slave chips.

The semiconductor layers LA1 through LAn transmit and receive a signal with respect to each other through-substrate vias (e.g., through-silicon vias) or TSVs, and the semiconductor layer LA1 as a master chip communicates with an outer memory controller (not shown) through a conductive unit (not shown) formed on an outer surface of the semiconductor memory device 6000. A structure and operations of the semiconductor memory device 6000 will now be described based on a first semiconductor layer LA1 as a master chip and an (n)th semiconductor layer LAn as a slave chip.

The first semiconductor layer LA1 includes various circuits for driving cell arrays 6210 included in slave chips. For example, the first semiconductor layer LA1 may include a row decoder 6110 for driving a word line of the cell array 6210, a column decoder 6120 for driving a bit line of the cell array 6210, a data input/output unit 6130 for controlling input and output of data, a command buffer 6140 for receiving a refresh command CMD from outside the semiconductor memory device 6000, and an address buffer 6150 for buffering an address received from outside the semiconductor memory device 6000.

Also, the first semiconductor layer LA1 may further include a DRAM management unit 6160 for managing a memory operation of a slave chip. The DRAM management unit 6160 may control the number of cells being refreshed per refresh control signal as described above, and accordingly, the DRAM management unit 6160 may include a cycle selector 6161 and an address converter 6162.

Meanwhile, the (n)th semiconductor layer LAn may include the cell array 6210 and a peripheral circuit region 6220 where other peripheral circuits for driving the cell array 6210, such as a row/column selector (not shown) for selecting a row and a column of the cell array 6210 and a bit line sense amplifier (not shown), are disposed.

According to the semiconductor memory device, the memory system, and the method of operating the semiconductor memory device described above, a process yield may be improved regardless of a level of difficulty of a process since a refresh cycle may be precisely controlled, and an optimum refresh operation may be performed according to a data retention characteristic of a memory cell.

Also, according to the semiconductor memory device, the memory system, and the method of operating the semiconductor memory device, by controlling a refresh cycle according to a data retention characteristic of a memory cell, power consumption during a refresh operation may be reduced and data may be stably maintained.

While the present disclosure has been particularly shown and described with reference to exemplary embodiments thereof, it will be understood that various changes in form and details may be made therein without departing from the spirit and scope of the following claims.

What is claimed is:

1. A semiconductor memory device comprising:
a first memory bank including a plurality of first pages;
a second memory bank including a plurality of second pages;
an address counter configured to generate count signals in response to a refresh command;
an address converter configured to generate refresh addresses based on the count signals;
a first row decoder configured to generate first refresh addresses for refreshing memory cells of the first pages based on the refresh addresses; and
a second row decoder configured to generate second refresh addresses for refreshing memory cells of the second pages based on the refresh addresses,
wherein a number of memory cells of the first pages to be refreshed is different from a number of memory cells of the second pages during one refresh cycle based on one of the refresh addresses.

2. The semiconductor memory device of claim 1, wherein the first row decoder is configured to selectively perform a first don't-care processing on a first bit among upper bits of one of the refresh addresses and output one of the refresh addresses that is first don't-care processed as one of the first refresh addresses.

3. The semiconductor memory device of claim 2, wherein the first row decoder is configured to perform the first don't-care processing in response to a temperature inside the semiconductor memory device.

4. The semiconductor memory device of claim 2, wherein memory cells connected to at least two pages of the first pages are simultaneously refreshed according to the one of the first refresh addresses.

5. The semiconductor memory device of claim 1, wherein the second row decoder is configured to selectively perform a second don't-care processing on a second bit among upper bits of one of the refresh addresses and output one of the refresh addresses that are second don't-care processed as one of the second refresh addresses.

6. The semiconductor memory device of claim 5, wherein memory cells connected to at least two pages of the second memory bank are simultaneously refreshed according to the one of the second refresh addresses.

* * * * *